US010770154B2

(12) United States Patent
Yu et al.

(10) Patent No.: US 10,770,154 B2
(45) Date of Patent: Sep. 8, 2020

(54) SEMICONDUCTOR MEMORY DEVICES AND MEMORY SYSTEMS HAVING THE SAME

(71) Applicant: Samsung Electronics Co., Ltd., Suwon-si, Gyeonggi-do (KR)

(72) Inventors: Seong-Heon Yu, Hwaseong-si (KR); Joung Yeal Kim, Hwaseong-si (KR); Chul Ung Kim, Hwaseong-si (KR); Hyun Bo Kim, Hwaseong-si (KR); Joo Youn Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/294,058

(22) Filed: Mar. 6, 2019

(65) Prior Publication Data
US 2020/0082889 A1  Mar. 12, 2020

(30) Foreign Application Priority Data

Sep. 7, 2018 (KR) .................. 10-2018-0107001

(51) Int. Cl.
| | | |
|---|---|---|
| *G11C 11/406* | (2006.01) | |
| *G11C 5/14* | (2006.01) | |
| *G11C 16/34* | (2006.01) | |
| *G11C 16/08* | (2006.01) | |
| *G11C 16/16* | (2006.01) | |
| *G11C 16/20* | (2006.01) | |

(52) U.S. Cl.
CPC .......... *G11C 16/3418* (2013.01); *G11C 5/147* (2013.01); *G11C 11/406* (2013.01); *G11C 16/08* (2013.01); *G11C 16/16* (2013.01); *G11C 16/20* (2013.01)

(58) Field of Classification Search
CPC ........ G11C 5/147; G11C 5/148; G11C 11/406; G11C 11/40615; G11C 11/40618
USPC ................................................. 365/222, 226
See application file for complete search history.

(56) References Cited

U.S. PATENT DOCUMENTS

| | | |
|---|---|---|
| 6,301,184 B1 | 10/2001 | Sasaki |
| 6,363,025 B1 | 3/2002 | McLaury |
| 6,463,509 B1 | 10/2002 | Teoman |
| 7,656,718 B2 | 2/2010 | Jeong |

(Continued)

FOREIGN PATENT DOCUMENTS

| | | |
|---|---|---|
| KR | 20080057641 | 6/2008 |
| KR | 20130111074 | 10/2013 |

(Continued)

*Primary Examiner* — Son L Mai
(74) *Attorney, Agent, or Firm* — Myers Bigel, P.A.

(57) ABSTRACT

Provided are a semiconductor memory device and a memory system including the same. The semiconductor memory device includes a power-up signal generator configured to generate a power-up signal in response to a memory voltage reaching a target voltage level, an initializer configured to generate an initialization signal in response to the power-up signal and a reset signal and to generate an initial refresh command in response to completion of an initialization operation, and a memory cell array including a plurality of memory cells connected between a plurality of word lines and a plurality of bit lines, the memory cell array configured to perform an initial refresh operation on the plurality of memory cells in response to the initial refresh command.

19 Claims, 10 Drawing Sheets

(56) References Cited

U.S. PATENT DOCUMENTS

| | | | |
|---|---|---|---|
| 7,764,562 B2* | 7/2010 | Cheon | G11C 5/147 365/185.03 |
| 7,872,511 B2* | 1/2011 | Chung | H03K 3/0375 327/143 |
| 9,412,434 B1* | 8/2016 | Ko | G11C 7/20 |
| 9,431,087 B2 | 8/2016 | Lee | |
| 9,922,690 B2 | 3/2018 | Chae | |
| 2013/0262740 A1 | 10/2013 | Kim | |
| 2014/0075174 A1 | 3/2014 | Bartling | |

FOREIGN PATENT DOCUMENTS

| | | |
|---|---|---|
| KR | 20160014976 | 2/2016 |
| KR | 20160074210 | 6/2016 |

\* cited by examiner

| MCA1(8) |
|---|
| MCA2(1) |
| MCA3(5) |
| MCA4(3) |
| MCA5(7) |
| MCA6(2) |
| MCA7(6) |
| MCA8(4) |
| MCA9(16) |
| MCA10(9) |
| MCA11(13) |
| MCA12(11) |
| MCA13(15) |
| MCA14(10) |
| MCA15(14) |
| MCA16(12) |
| MCA17(8) |
| MCA18(1) |
| MCA19(5) |
| MCA20(3) |
| MCA21(7) |
| MCA22(2) |
| MCA23(6) |
| MCA24(4) |
| MCA25(16) |
| MCA26(10) |
| MCA27(11) |
| MCA28(12) |
| MCA29(9) |
| MCA30(10) |
| MCA31(11) |
| MCA32(12) |

(b)

| MCA1(8) |
|---|
| MCA2(1) |
| MCA3(5) |
| MCA4(3) |
| MCA5(7) |
| MCA6(2) |
| MCA7(6) |
| MCA8(4) |
| MCA9(8) |
| MCA10(1) |
| MCA11(5) |
| MCA12(3) |
| MCA13(7) |
| MCA14(2) |
| MCA15(6) |
| MCA16(4) |
| MCA17(8) |
| MCA18(1) |
| MCA19(5) |
| MCA20(3) |
| MCA21(7) |
| MCA22(2) |
| MCA23(6) |
| MCA24(4) |
| MCA25(8) |
| MCA26(1) |
| MCA27(5) |
| MCA28(3) |
| MCA29(7) |
| MCA30(2) |
| MCA31(6) |
| MCA32(4) |

SEMICONDUCTOR MEMORY DEVICES AND MEMORY SYSTEMS HAVING THE SAME

CROSS-REFERENCE TO RELATED APPLICATION

This application claims priority under 35 U.S.C. § 119 to Korean Patent Application No. 10-2018-0107001, filed on Sep. 7, 2018, in the Korean Intellectual Property Office (KIPO), the entire contents of which are incorporated herein by reference.

BACKGROUND

1. Field

Devices and systems consistent with example embodiments of the inventive concepts relate to a semiconductor memory devices and memory systems including the same.

2. Description of Related Art

A semiconductor memory device may include a memory cell array including a plurality of memory cells. The semiconductor memory device may perform an initialization operation in response to a power-up signal and a reset signal. When the initialization operation of the semiconductor memory device is completed, the semiconductor memory device may be prepared for a normal operation and receive a valid command.

SUMMARY

The example embodiments of the inventive concepts are directed to providing semiconductor memory devices and memory systems including the same, which may reliably initialize data of a plurality of memory cells included in a memory cell array in an initialization operation.

Aspects of the inventive concepts should not be limited by the above description, and other unmentioned aspects will be clearly understood by one of ordinary skill in the art from example embodiments described herein.

According to example embodiments, there is provided a semiconductor memory device including a power-up signal generator configured to generate a power-up signal in response to a memory voltage reaching a target voltage level, an initializer configured to generate an initialization signal in response to the power-up signal and a reset signal and to generate an initial refresh command in response to completion of an initialization operation, and a memory cell array including a plurality of memory cells connected between a plurality of word lines and a plurality of bit lines, the memory cell array configured to perform an initial refresh operation on the plurality of memory cells in response to the initial refresh command.

According to example embodiments, there is provided a semiconductor memory device including a power-up signal generator configured to generate a power-up signal in response to a memory voltage reaching a target voltage level, an initializer configured to generate an initialization signal in response to the power-up signal and a reset signal and to generate an initial refresh command and an initial write command in response to completion of an initialization operation, an initial data driver configured to drive initial data in response to the initial write command, and a memory cell array including a plurality of memory cells connected between a plurality of word lines and a plurality of bit lines, the memory cell array configured to perform an initial write operation of writing the initial data to the plurality of memory cells in response to the initial refresh command and the initial write command.

According to example embodiments, there is provided a memory system including a controller configured to generate a reset signal in response to a power-up operation signal or a reset operation signal and a memory configured to receive the reset signal. The memory includes a power-up signal generator configured to generate a power-up signal in response to a memory voltage reaching a target voltage level, an initializer configured to generate an initialization signal in response to the power-up signal and the reset signal and to generate an initial refresh command in response to completion of an initialization operation, and a memory cell array including a plurality of memory cells connected between a plurality of word lines and a plurality of bit lines, the memory cell array configured to perform an initial refresh operation on the plurality of memory cells in response to the initial refresh command.

BRIEF DESCRIPTION OF THE DRAWINGS

FIG. 10 is a diagram illustrating an example of an order in which an initial refresh operation or an initial write operation is performed on memory cell array blocks of a memory cell array according to an embodiment of the inventive concepts.

DETAILED DESCRIPTION

Hereinafter, semiconductor memory devices and memory systems including the same according to embodiments of the inventive concepts will be described with reference to the accompanying drawings.

Figure 1:
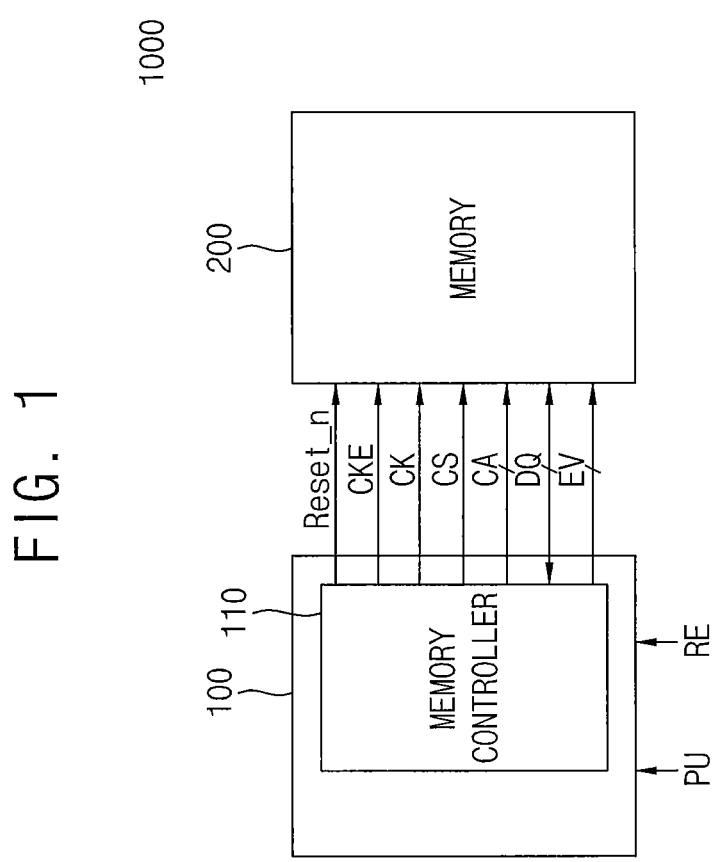
FIG. 1 is a block diagram illustrating a configuration of a memory system according to an embodiment of the inventive concepts.

FIG. 1 is a block diagram illustrating a configuration of a memory system 1000 according to an embodiment of the inventive concepts. The memory system 1000 may include a controller 100 and a memory 200. The controller 100 may include a memory controller 110. The memory 200 may be a semiconductor memory device and/or a memory module including a plurality of semiconductor memory devices.

Functions of respective blocks shown in FIG. 1 are as described below.

The controller 100 may receive a power-up operation signal PU or a reset operation signal RE. The memory controller 110 may transmit a reset signal Reset_n, a clock enable signal CKE, a clock signal CK, a chip selection signal CS, a command/address CA, data DQ, and/or a memory voltage EV (e.g., VDD, VSS, VDDQ, VSSQ, and the like) to the memory 200. When the power-up operation signal PU and/or the reset operation signal RE is applied to the memory controller 110, the memory controller 110 may generate the reset signal Reset_n. The controller 100 may internally generate the memory voltage EV (e.g., a voltage such as VDD, VSS, VPP, VDDQ, and the like) in response to the power-up operation signal PU. Unlike that which is shown, the memory voltage EV may be generated not by the memory controller 110, but by an additional voltage generator (not shown).

The memory 200 may receive the reset signal Reset_n, the clock enable signal CKE, the clock signal CK, the chip selection signal CS, the command/address CA, the data DQ, and/or the memory voltage EV and may transmit the data DQ to the memory controller 110. Further, the memory 200 may perform an initialization operation in response to the reset signal Reset_n.

Figure 2:
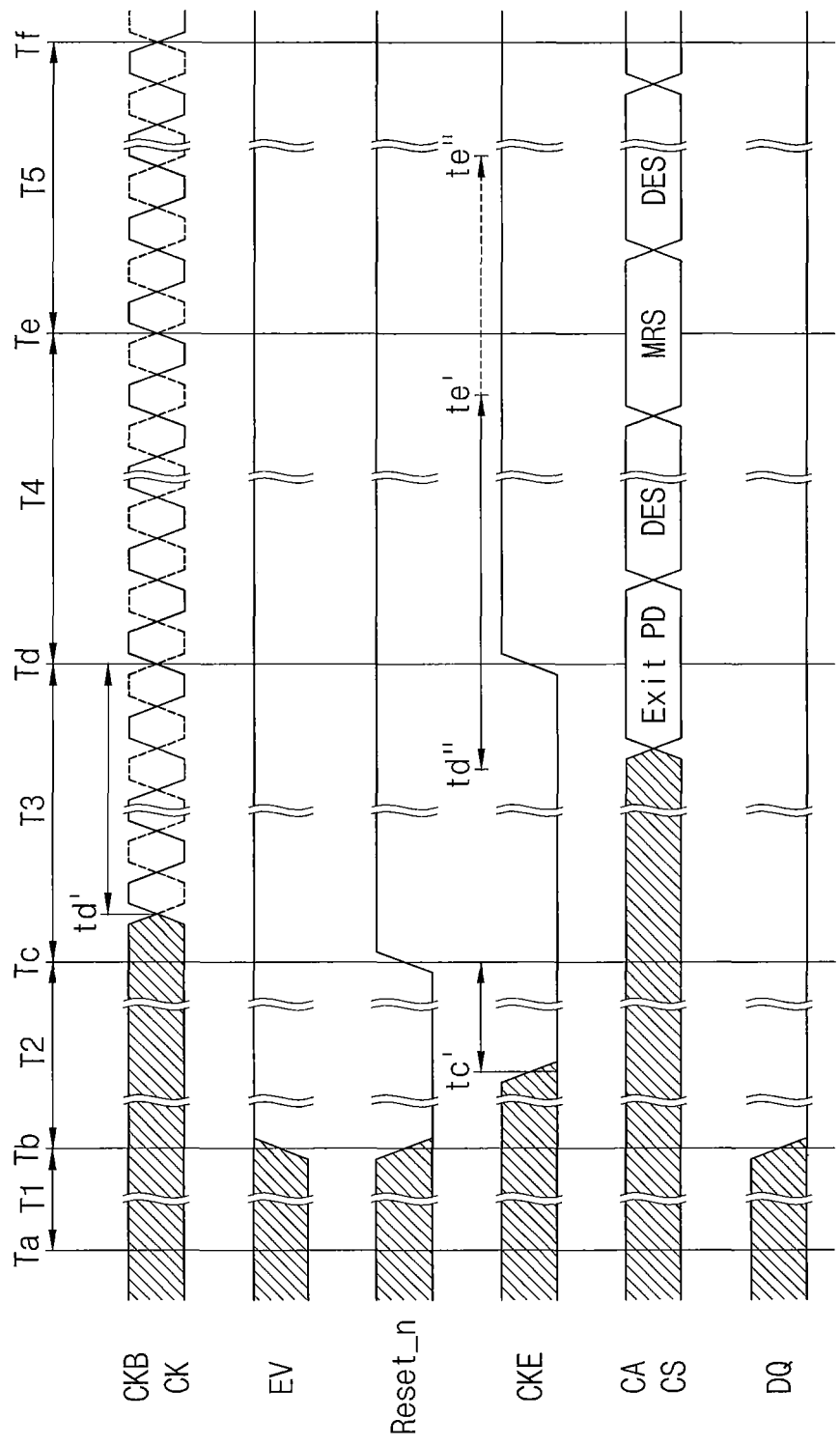
FIG. 2 is an operation timing diagram illustrating an initialization operation of the memory system shown in FIG. 1.

FIG. 2 is an operation timing diagram illustrating an initialization operation of the memory system 1000 shown in FIG. 1. FIG. 2 is a timing diagram of signals and voltages that may be applied to the memory 200 by the memory controller 110 when a power-up operation signal PU is applied to the controller 100. The memory controller 110 may apply an inverted clock signal CKB along with the clock signal CK.

Referring to FIG. 2, when the power-up operation signal PU is applied to the controller 100, the memory controller 110 may supply a memory voltage EV to the memory 200 from a first time point Ta. At a second time point Tb, the memory voltage EV may reach a target voltage level. A first time period T1 (e.g., a time period between the first time point Ta and the second time point Tb) may be a voltage ramp time period.

During a second time period T2 from the second time point Tb to a third time point Tc, the memory controller 110 may apply a reset signal Reset_n of a "low" level to the memory 200. The second time period T2 may be a reset time period for which a reset signal Reset_n is applied.

At the third time point Tc, the memory controller 110 may apply a reset signal Reset_n, which transitions from a "low" level to a "high" level, to the memory 200. After the memory voltage EV reaches the target voltage level, when the reset signal Reset_n of a "high" level is applied to the memory 200, the memory 200 may internally start an initialization operation.

At a fourth time point tc' prior to the third time point Tc, the memory controller 110 may apply a clock enable signal CKE of a "low" level.

At a fifth time point Td, the memory controller 110 may apply a clock enable signal CKE, which transitions from a "low" level to a "high" level, and a chip selection signal CS of a "high" level instructing a power-down exit command Exit PD in response to the clock signal CK. The memory 200 may exit a power-down mode in response to the power-down exit command Exit PD. From a sixth time point td' prior to the fifth time point Td, the memory controller 110 may apply the clock signal CK.

During a third time period T3 from the third time point Tc to the fifth time point Td, the memory 200 may perform an initialization operation. The third time period T3 may be an initialization operation period for setting internal nodes of internal function blocks of the memory 200 to an initial value. Although the memory controller 110 may apply the power-down exit command Exit PD at the fifth time point Td, the initialization operation of the memory 200 may be completed at a seventh time point td" before the fifth time point Td and after the sixth time point td'. That is, the fifth time point Td at which the memory controller 110 applies the power-down exit command Exit PD may be a time obtained by adding a predetermined margin to a time duration taken for the initialization operation of the memory 200. The initialization operation of the memory 200 may be substantially completed at the seventh time point td".

The memory 200 may start an initial refresh operation or an initial write operation on a memory cell array (not shown) from the seventh time point td". The initial refresh operation or the initial write operation of the memory 200 may be performed at least one time. Thus, data "0" or "1" may be reliably stored in a plurality of memory cells of the memory cell array (not shown) of the memory 200.

During a fourth time period T4 from the fifth time point Td to an eighth time point Te, that is, from the fifth time point Td until the eighth time point Te at which a mode setting command MRS is applied, the memory 200 may be in an idle state. That is, the fourth time period T4 may be an idle time period. In some embodiments, during the idle time period, other commands (e.g., a device deselect command DES) may be issued. The initial refresh operation or initial write operation of the memory 200 may start at the seventh time point td" and ends at a ninth time point te'.

During a fifth time period T5 from the eighth time point Te to a tenth time point Tf, a mode setting operation may be performed in response to the mode setting command MRS. That is, the fifth time period T5 may be a mode setting operation time period. Since the memory 200 performs the mode setting operation regardless of the initial refresh operation or the initial write operation, the initial refresh operation or the initial write operation of the memory 200 may start at the seventh time point td" and end at an eleventh time point te". The next command may be applied at the tenth time point Tf.

That is, the initial refresh operation or the initial write operation of the memory 200 according to embodiments of the inventive concepts may start at the seventh time point td" before the fifth time point Td at which the power-down exit command Exit PD is applied and after the sixth time point td' at which the clock signal CK is applied.

When the reset operation signal RE is applied to the controller 100, the above-described operations after the second time point Tb may be performed.

The above-described operation timing diagram illustrates power-up and initialization operations of a low-power double-data-rate (LPDDR) dynamic random access memory (DRAM) device. Although not shown, the power-up and initialization operations according to embodiments of the inventive concepts may also be applied to power-up and initialization operations of a double-data-rate (DDR) DRAM device.

Figure 3:
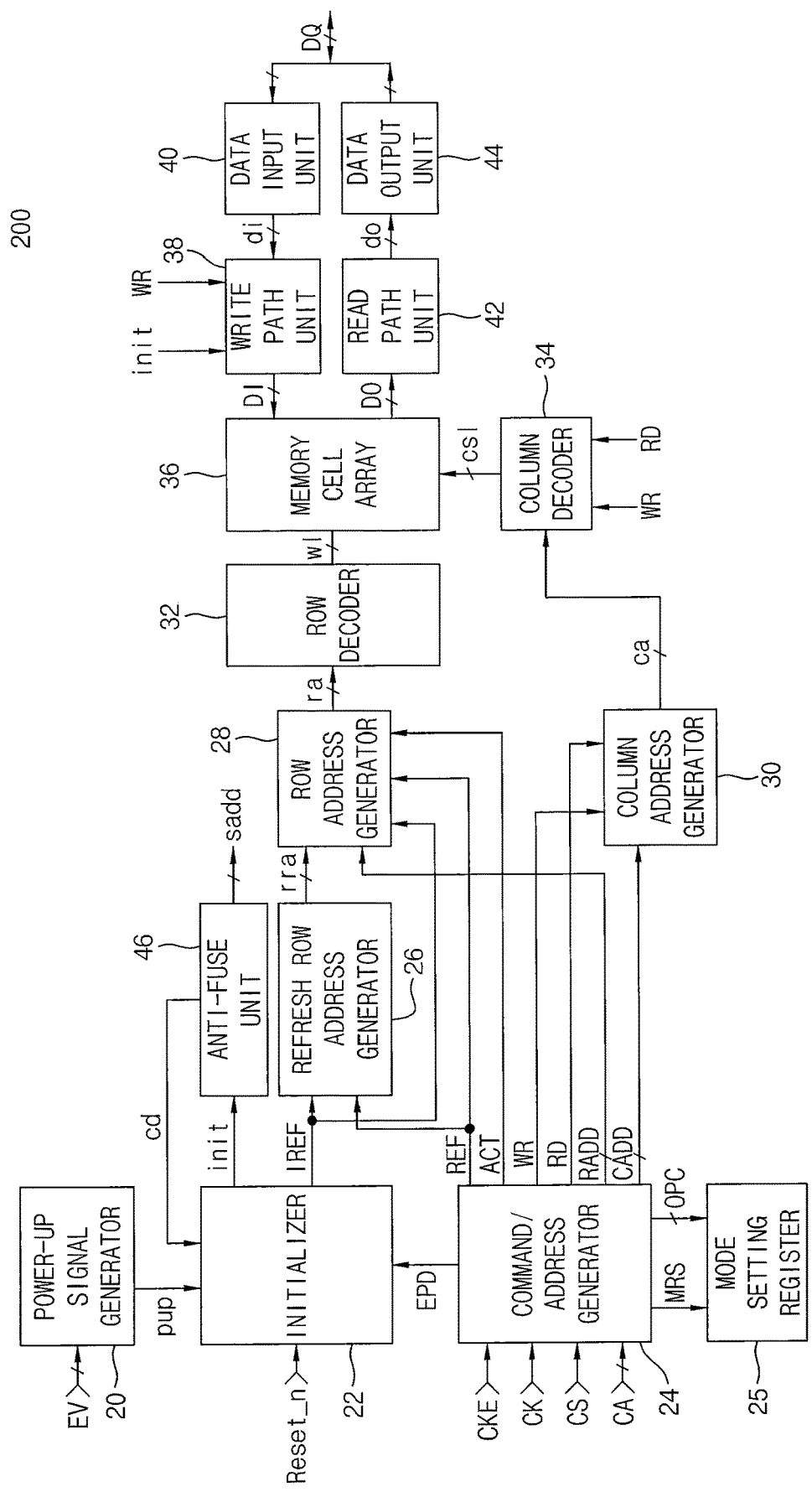
FIG. 3 is a block diagram illustrating a configuration of a semiconductor memory device according to an embodiment of the inventive concepts.

FIG. 3 is a block diagram illustrating a configuration of a semiconductor memory device 200 according to an embodiment of the inventive concepts. The semiconductor memory device 200 may include a power-up signal generator 20, an initializer 22, a command/address generator 24, a mode setting register 25, a refresh row address generator 26, a row address generator 28, a column address generator 30, a row decoder 32, a column decoder 34, a memory cell array 36, a write path unit 38, a data input unit 40, a read path unit 42, a data output unit 44, and an anti-fuse unit 46.

Functions of the respective blocks shown in FIG. 3 are as described below.

The power-up signal generator 20 may detect a level of a memory voltage EV and generate a power-up signal pup when the memory voltage EV reaches a target voltage level.

The initializer 22 may generate an initialization signal init in response to the power-up signal pup and a reset signal Reset_n, and exit a power-down mode in response to a power-down exit command EPD. When an initialization completion signal cd is applied to the initializer 22, the initializer 22 may generate an initial refresh command IREF.

The command/address generator 24 may receive a clock enable signal CKE and a chip selection signal CS in response to a clock signal CK and generate a power-down exit command EPD. The command/address generator 24 may decode the chip selection signal CS and a command/address CA in response to the clock signal CK and generate a refresh command REF, an active command ACT, a write command WR, a read command RD, and/or a mode setting command MRS. For example, the command/address generator 24 may generate the power-down exit command EPD when the clock enable signal CKE transitions from a "low" level to a "high" level and the chip selection signal CS is at a "low" level at a rising edge of the clock signal CK. Further, the command/address generator 24 may generate a row address RADD from an address signal included in the command/address CA in response to the active command ACT, generate a column address CADD from an address signal included in the command/address CA in response to the write command WR or the read command RD, and/or generate a mode setting code OPC from an address signal included in the command/address CA in response to the mode setting command MRS.

The mode setting register 25 may store the mode setting code OPC in response to the mode setting command MRS.

The refresh row address generator 26 may generate the refresh row address rra in response to the initial refresh command IREF or the refresh command REF.

The row address generator 28 may generate a row address signal ra from the refresh row address rra in response to the initial refresh command IREF or the refresh command REF, or may generate the row address signal ra from a row address RADD in response to the active command ACT.

The column address generator 30 may generate a column address signal ca from the column address CADD in response to the write command WR or the read command RD.

The row decoder 32 may decode the row address signal ra and generate a plurality of word line selection signals wl.

The column decoder 34 may decode the column address signal ca and generate a plurality of column selection signals csl. In some embodiments, the column decoder 34 may take the write command WR and/or the read command RD as input.

The memory cell array 36 may include a plurality of memory cells (not shown), which are connected between a plurality of word lines selected based on the plurality of word line selection signals wl and a plurality of bit lines selected based on the plurality of column selection signals csl. The memory cell array 36 may input data to the memory cells, which are selected based on the plurality of word line selection signals wl and the plurality of column selection signals csl in response to the write command WR, and output data from the selected memory cells in response to the read command RD. Furthermore, the memory cell array 36 may perform an initial refresh operation or a refresh operation on the plurality of memory cells in response to the initial refresh command IREF or the refresh command REF. The initial refresh operation may be the same as, or different from, the refresh operation. At least two (four, eight, or the like, i.e., $2^n$ (n being a natural number)) word lines in the memory cell array 36 may be simultaneously selected in response to the initial refresh command IREF, the initial refresh operation may be performed on the memory cells (not shown) connected to the selected at least two word lines, and data "0" or data "1" may be stored based on the accumulated amount of charges of each of the memory cells (not shown) connected to the selected at least two word lines.

The write path unit 38 may be initialized in response to the initialization signal init and have initial data. The write path unit 38 may input data di and write data DI to the memory cell array 36, in response to the write command WR.

When the write command WR is generated, the data input unit 40 may input data DQ and output data di to the write path unit 38.

When the read command RD is generated, the read path unit 42 may read data DO read from the memory cell array 36 and output data do.

When the read command RD is generated, the data output unit 44 may input the data do output by the read path unit 42 and output data DQ.

The anti-fuse unit 46 may program a failure address signal and output the programmed failure address signal sadd when the initialization signal init is generated. The anti-fuse unit 46 may generate the initialization completion signal cd when the programmed failure address signal sadd is output. The anti-fuse unit 46 may be a final initialization operation unit (also referred to herein as an initialization operation unit) configured to finally perform an initialization operation in an initialization operation during the third time period T3 of FIG. 2.

Although not shown, during the third time period T3 of FIG. 2, internal nodes of the command/address generator 24, the mode setting register 25, the refresh row address generator 26, the row address generator 28, the column address generator 30, the row decoder 32, the column decoder 34, the data input unit 40, the read path unit 42, and/or the data output unit 44 may be initialized in response to the initialization signal init generated by the initializer 22 and have initial values.

Although not shown, the memory cell array 36 may include redundant memory cells, which are connected between redundant word lines selected based on a redundant word line selection signal or redundant bit lines selected based on a redundant column selection signal. The failure address signal sadd may be applied to the row decoder 32 or the column decoder 34. When the row address signal ra or the column address signal ca is consistent with the failure address signal sadd, the row decoder 32 and/or the column decoder 34 may not activate a word line selection signal and/or a column selection signal corresponding to the row address signal ra and/or the column address signal ca, but instead may activate the redundant word line selection signal and/or the redundant column selection signal. Thus, defective memory cells of the memory cell array 36 may be replaced by redundant memory cells.

Figure 4:
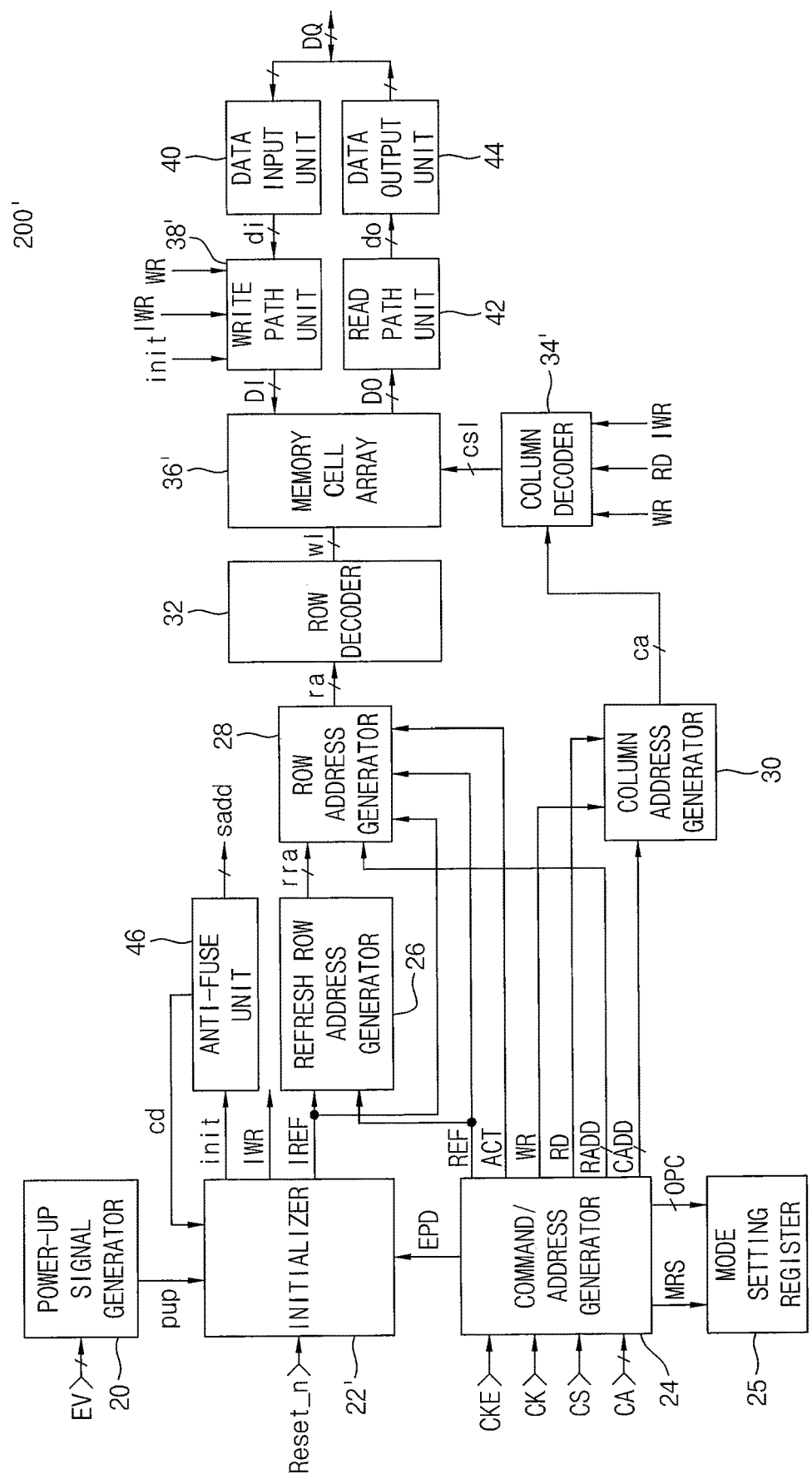
FIG. 4 is a block diagram illustrating a configuration of a semiconductor memory device according to an embodiment of the inventive concepts.

FIG. 4 is a block diagram of a configuration of a semiconductor memory device 200' according to an embodiment of the inventive concepts. The semiconductor memory device 200' may be configured by replacing the initializer 22, the column decoder 34, the memory cell array 36, and the write path unit 38 of the semiconductor memory device 200 shown in FIG. 3 with an initializer 22', a column decoder 34', a memory cell array 36', and a write path unit 38', respectively.

A function of each of replaced blocks of blocks shown in FIG. 4 is as described below.

The initializer 22' may perform the same operation as the initializer 22 shown in FIG. 3. In addition, when an initialization completion signal cd is applied, the initializer 22' may further generate an initial write command IWR.

The column decoder 34' may perform the same operation as the column decoder 34 shown in FIG. 3. In addition, the column decoder 34' may activate (in some embodiments, simultaneously) a plurality of column selection signals csl in response to the initial write command IWR.

The write path unit 38' may perform the same operation as the write path unit 38 shown in FIG. 3. In addition, the write path unit 38' may output initial data to the memory cell array 36 in response to the initial write command IWR.

The memory cell array 36' may include a plurality of memory cells (not shown) like the memory cell array 36 shown in FIG. 3. The memory cell array 36' may perform the same operations as the memory cell array 36 shown in FIG. 3 in response to a write command WR, a read command RD, and/or a refresh command REF. In addition, the memory cell array 36' may perform an initial write operation on the plurality of memory cells in response to an initial refresh command IREF and the initial write command IWR. The memory cell array 36' may perform an initial write operation of simultaneously selecting at least two (e.g., four, eight, or the like, i.e., $2^n$ (n being a natural number)) word lines in response to the initial refresh command IREF and writing the initial data to memory cells (not shown) connected to the at least two selected word lines. The initial write operation may include performing an initial refresh operation on the memory cells (not shown) connected to the at least two selected word lines and writing the initial data.

Figure 5:
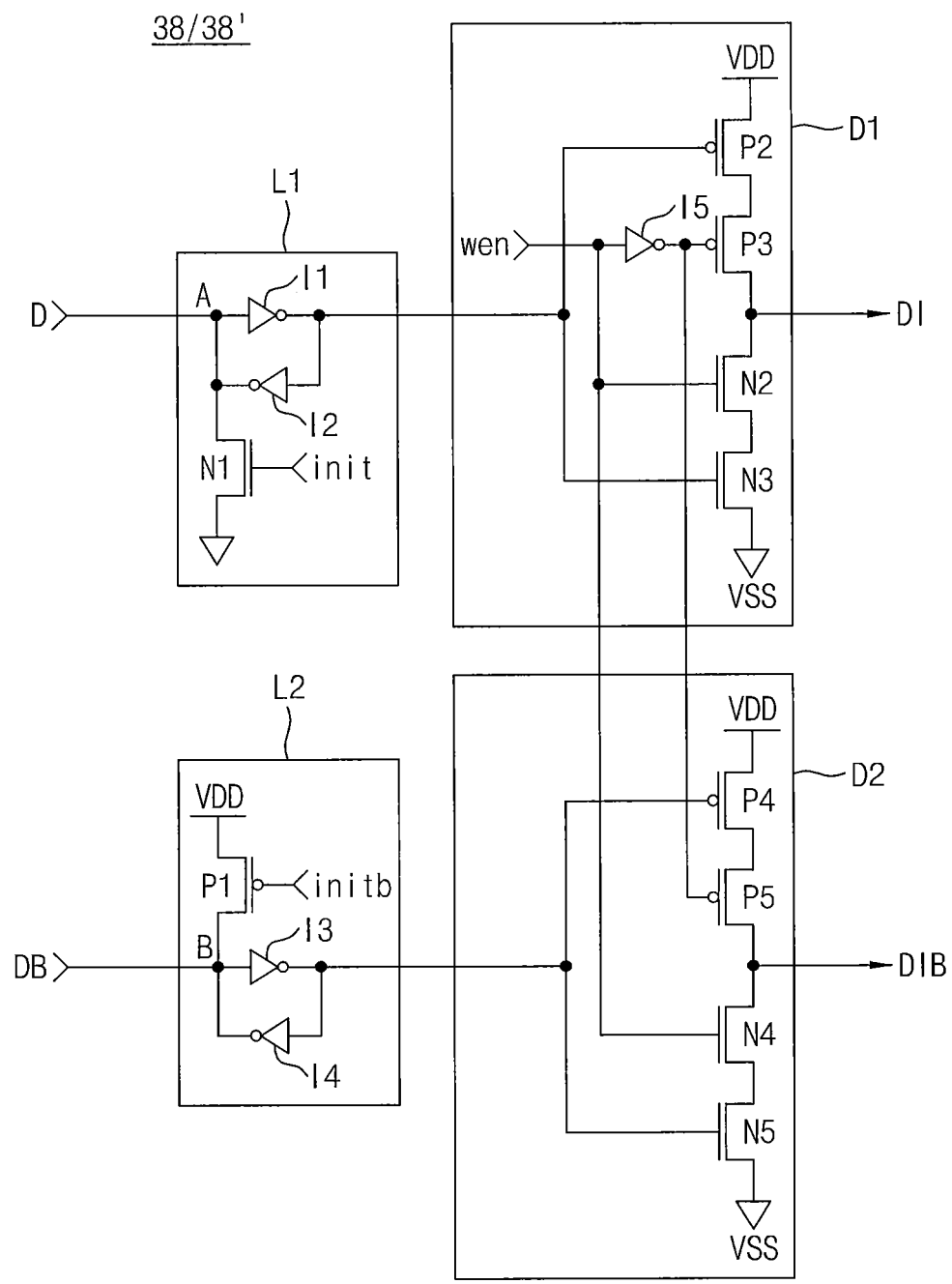
FIG. 5 is a circuit diagram illustrating a configuration of a write path unit according to an embodiment of the inventive concepts.

FIG. 5 is a circuit diagram illustrating a configuration of a portion of a write path unit 38 or 38' according to an embodiment of the inventive concepts.

Referring to FIG. 5, the write path unit 38 or 38' may include first and second latches L1 and L2 and first and second drivers D1 and D2. The first latch L1 may include first and second inverters I1 and I2 and a first NMOS transistor N1, and the second latch L2 may include third and fourth inverters I3 and I4 and a first PMOS transistor P1. The first driver D1 may include a second inverter I5, second and third PMOS transistors P2 and P3, and second and third NMOS transistors N2 and N3. The second driver D2 may include fourth and fifth PMOS transistors P4 and P5 and fourth and fifth NMOS transistors N4 and N5.

When the write command WR is generated in a normal operation, the write path unit 38 shown in FIG. 3 may generate a write enable signal wen of a "high" level. When the write command WR is generated in the normal operation or the initial write command IWR is generated in an initialization operation, the write path unit 38' of FIG. 4 may generate the write enable signal wen of the "high" level. The write enable signal wen may be generated in response to a clock signal CK.

Operations of the write path unit 38 or 38' shown in FIG. 5 are as described below.

When an initialization signal init of a "high" level (and, in some embodiments, an inverted initialization signal initb of a "low" level) is generated in the initialization operation, the first NMOS transistor N1 and the first PMOS transistor P1 may be turned on so that first and second nodes A and B may be initialized to a "low" level and a "high" level, respectively. The first inverter I1 may invert a signal of a "low" level of the first node A and generate a signal of a "high" level, while the third inverter I3 may invert a signal of a "high" level of the second node B and generate a signal of a "low" level. That is, in the initialization operation, the first latch L1 and the second latch L2 may initialize the first and second nodes A and B to the "low" level and the "high" level, respectively.

When an initialization signal init of a "low" level is generated in the normal operation, the first NMOS transistor N1 and the first PMOS transistor P1 may be turned off, the first inverter I1 may invert data D, and the third inverter I3 may invert inverted data DB. That is, in the normal operation, the first latch L1 and the second latch L2 may invert the data D and the inverted data DB.

When the write enable signal wen of the "high" level is generated in the initialization operation, the third and fifth PMOS transistors P3 and P5 and the second and fourth NMOS transistors N2 and N4 may be turned on so that operations of the first and second drivers D1 and D2 may be activated. The third NMOS transistor N3 of the first driver D1 may be turned on in response to a signal of a "high" level output by the first latch L1 so that the first driver D1 may generate data DI of a "low" level. The fourth PMOS transistor P4 of the second driver D2 may be turned on in response to a signal of a "low" level output by the second latch L2 so that the second driver D2 may generate inverted data DIB of a "high" level. That is, the write path unit 38' may generate the data DI of the "low" level and the inverted data DIB of the "high" level in an initialization operation.

When the write enable signal wen of the "high" level is generated in the normal operation, operations of the first driver D1 and the second driver D2 may be enabled, the first driver D1 may invert an output signal of the first latch L1 and generate data DI, and the second driver D2 may invert an output signal of the second latch L2 and generate inverted data DIB.

When the write enable signal wen of the "low" level is generated in the initialization operation or the normal operation, operations of the first driver D1 and the second driver D2 may be disabled.

Figure 6:
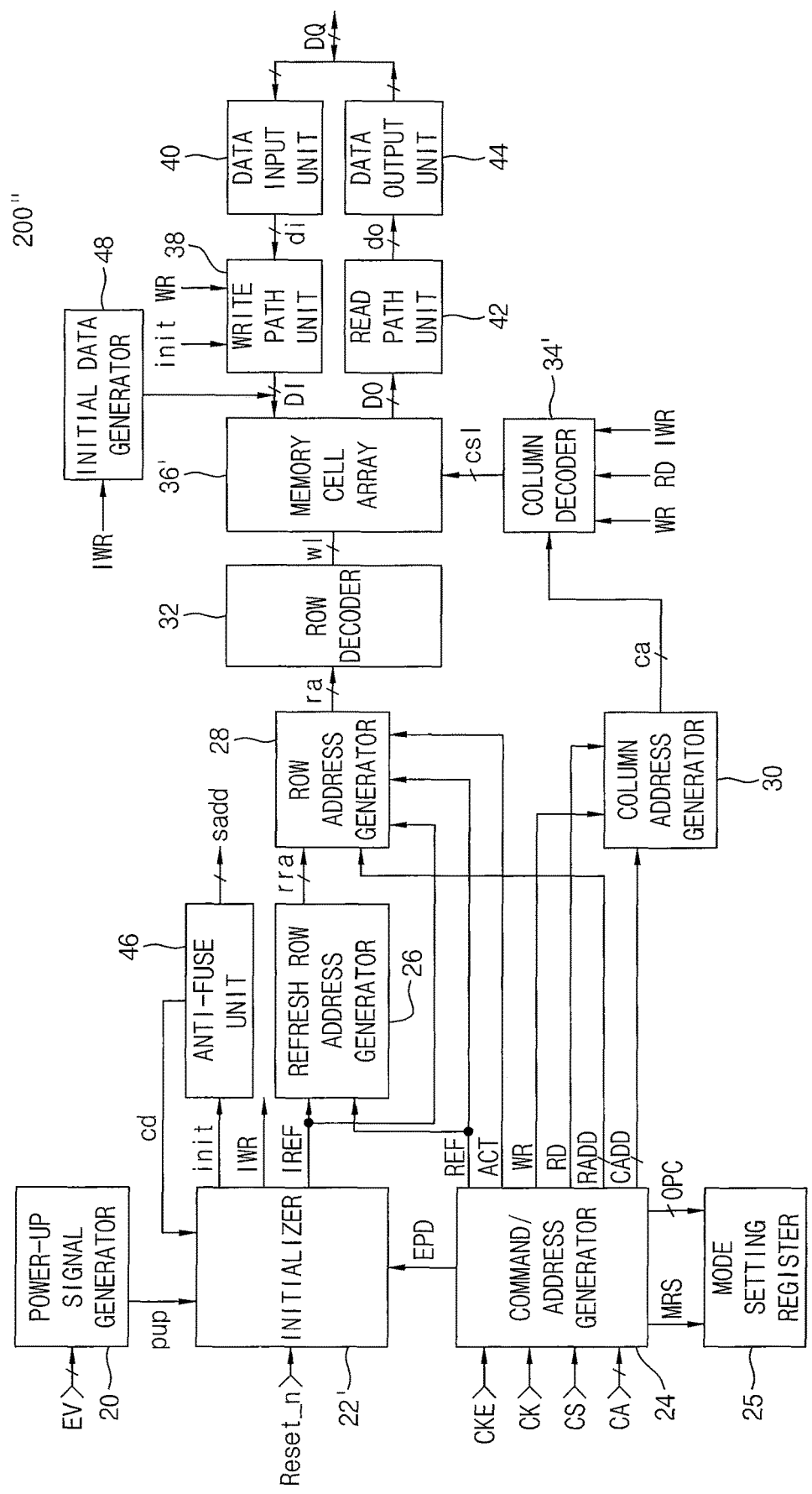
FIG. 6 is a block diagram illustrating a configuration of a semiconductor memory device according to an embodiment of the inventive concepts.

FIG. 6 is a block diagram of a configuration of a semiconductor memory device 200" according to an embodiment of the inventive concepts. The semiconductor memory device 200" may be configured by replacing the write path unit 38' of the semiconductor memory device 200' shown in FIG. 4 with the write path unit 38 of the semiconductor memory device 200 shown in FIG. 3 and further including an initial data generator 48.

Functions of replaced or added blocks of blocks shown in FIG. 6 are as described below.

The write path unit 38 may perform the same functions as the write path unit 38 shown in FIG. 3.

The initial data generator 48 may output initial data to a memory cell array 36' when an initial write command IWR is generated.

Although FIGS. 3, 4, and/or 6 illustrates a case in which the anti-fuse unit 46 generates an initialization completion signal cd, in some embodiments, the initializer 22 or 22' may detect the completion of an initialization operation of the anti-fuse unit 46 and generate an initial refresh command and/or initial write command.

Figure 7:
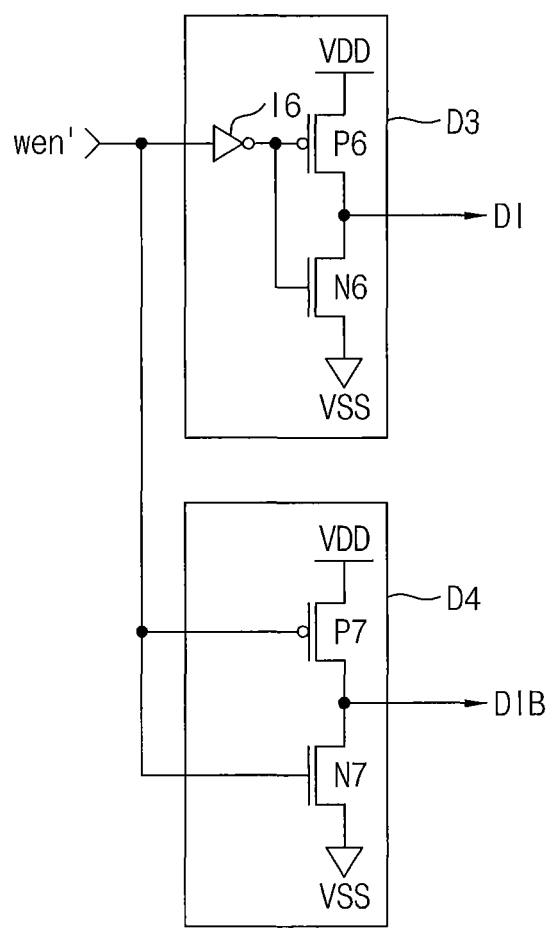
FIG. 7 is a circuit diagram illustrating a configuration of an initial data generator according to an embodiment of the inventive concepts.

FIG. 7 is a circuit diagram illustrating a configuration of the initial data generator 48 according to an embodiment of the inventive concepts. The initial data generator 48 may include a third driver D3 including a sixth inverter 16, a sixth PMOS transistor P6, and a sixth NMOS transistor N6 and a fourth driver D4 may include a seventh PMOS transistor P7 and a seventh NMOS transistor N7.

When an initial write command IWR is generated in an initialization operation, the initial data generator 48 shown in FIG. 7 may generate a write enable signal wen' of a "high" level. The write enable signal wen' may be generated in response to a clock signal CK.

Operations of the initial data generator 48 shown in FIG. 7 are as described below When the write enable signal wen' of the "high" level is generated in the initialization operation, the sixth PMOS transistor P6 may be turned on, and the sixth NMOS transistor N6 may be turned off. The third driver D3 may generate data DI of a "high" level. Further, the seventh PMOS transistor P7 may be turned off, and the seventh NMOS transistor N7 may be turned on. The fourth driver D4 may generate inverted data DIB of a "low" level.

The write path unit 38' or the initial data generator 48 of the semiconductor memory device 200' or 200" of FIG. 4 or FIG. 6 may be an initial data driver configured to drive initial data with respect to the memory cell array 36' when the initial write command IWR is generated.

Although the semiconductor memory device 200 shown in FIG. 3 performs the initial refresh operation based on the accumulated amount of charges of each of the plurality of memory cells of the memory cell array 36 and stores data, the semiconductor memory device 200' or 200" shown in FIG. 4 or FIG. 6 may perform an initial write operation of writing initial data to the plurality of memory cells of the memory cell array 36' using the initial data driver and may store initial data.

Figure 8:
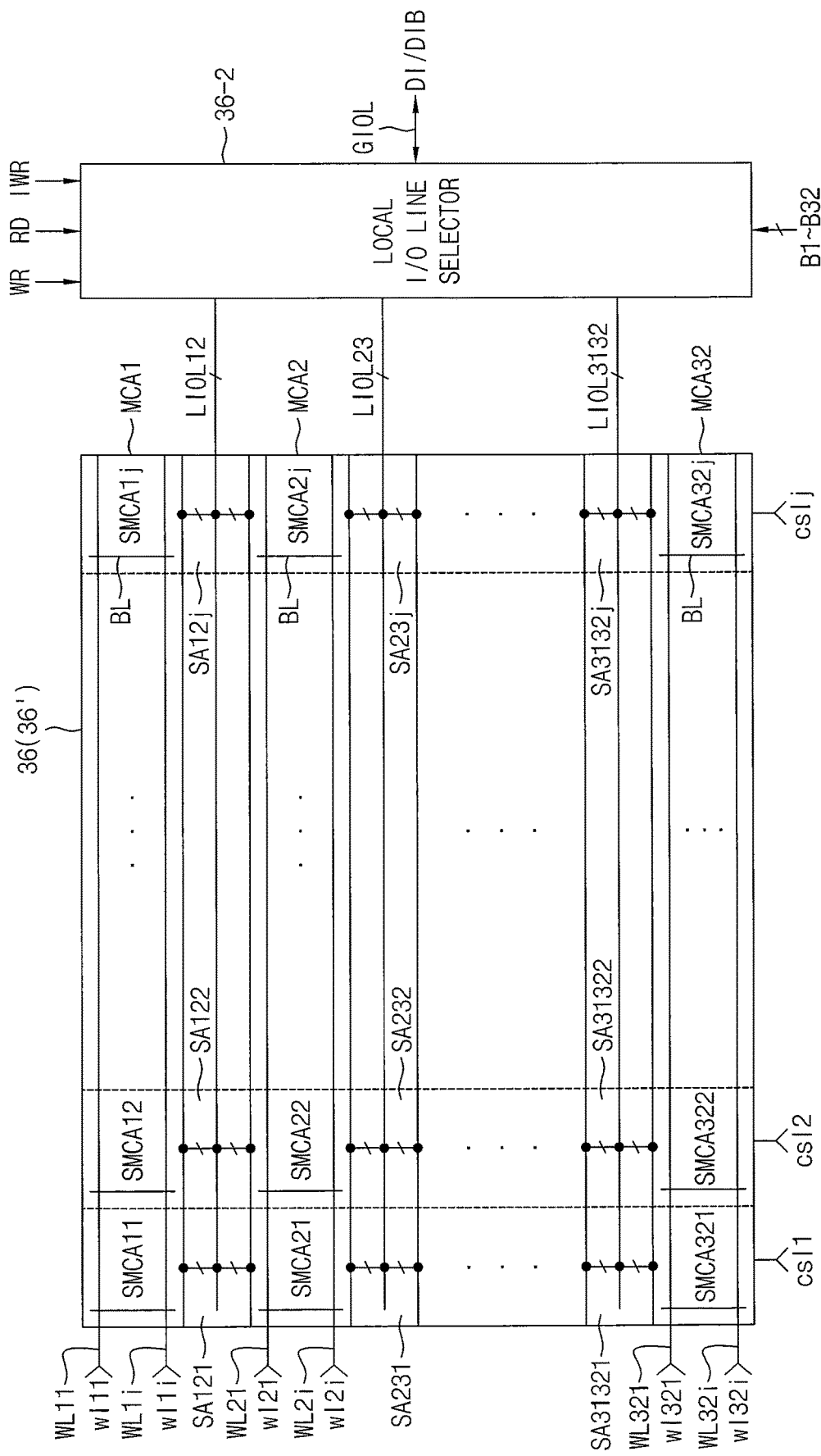
FIG. 8 is a block diagram illustrating a configuration of a memory cell array block according to an embodiment of the inventive concepts.

FIG. 8 is a block diagram illustrating a configuration of a memory cell array block according to an embodiment of the inventive concepts. The semiconductor memory devices 200, 200', and 200" may further include a local input/output (I/O) line selector 36-2.

Functions of respective blocks shown in FIG. 8 are as described below.

A memory cell array 36 or 36' may include 32 memory cell array blocks MCA1 to MCA32 and 31 sense amplification blocks SA12, SA23, . . . , and SA3132, which may be disposed between 32 memory cell array blocks MCA1 to MCA32.

Each of the memory cell array blocks MCA1 to MCA32 may respectively include j sub-memory cell array blocks (SMCA11 to SMCA1j), (SMCA21 to SMCA2j), . . . , and (SMCA321 to SMCA32j), where j is a non-negative integer value. Each of the memory cell array blocks MCA1 to MCA32 may include a plurality of memory cells (not shown) connected between word lines WL and a bit line BL, which are selected in response to the corresponding i word line selection signals (wl11 to wl1i), (wl21 to wl2i), . . . , or (wl321 to wl320, where i is an non-negative integer value. Although only one representative bit line of each of sub-memory cell array blocks (SMCA11 to SMCA1j), (SMCA21 to SMCA2j), . . . , and (SMCA321 to SMCA32j) is illustrated, a plurality of bit lines BL may be disposed in each of the sub-memory cell array blocks (SMCA11 to SMCA1j), (SMCA21 to SMCA2j), and (SMCA321 to SMCA32j)).

Each of the sense amplification blocks SA12, SA23, . . . , and SA3132 may respectively include j sub-sense amplification blocks (SA121 to SA12j), (SA231 to SA23j), . . . , and (SA31321 to SA33132j)). Each of the sense amplification blocks SA12, SA23, . . . , and SA3132 may be respectively shared between adjacent memory cell array blocks MCA1 and MCA2, MCA2 and MCA3, . . . , or MCA31 and MCA32. Each of the sub-sense amplification blocks SA121, SA122, . . . , SA12j, SA231, SA232, SA23j, SA31321, SA31322, . . . , and SA33132j may be used for the corresponding adjacent sub-memory cell array blocks SMCA11 and SMCA21, SMCA12 and SMCA22, SMCA1j and SMCA2j, SMCA21 and SMCA31, SMCA22 and SMCA32, SMCA2j and SMCA3j, SMCA311 and SMCA321, SMCA312 and SMCA322, . . . , and SMCA31j and SMCA32j, respectively. A corresponding local I/O line group LIOL12, LIOL23, . . . , and/or LIOL3132 may be respectively disposed in the corresponding sense amplification block SA12, SA23, . . . , and SA3132. The corresponding sub-sense amplification blocks (SA121, SA231, . . . , SA31321), (SA122, SA232, . . . , SA31322), . . . , and/or (SA12j, SA23j, SA3132j) may transmit data between the corresponding local I/O line group LIOL12, LIOL23, . . . , and/or LIOL3132 and the corresponding adjacent sub-memory cell array blocks (SMCA11 and SMCA21) to (SMCA1j and SMCA2j), . . . , and/or (SMCA311 and SMCA321) to (SMCA31j and SMCA32j) in response to the corresponding column selection signal csl1, csl2, . . . , and/or cslj. For example, when a word line of each of the memory cell array blocks MCA1 to MCA32 is selected, the corresponding adjacent sense amplification blocks SA12, (SA12, SA23), (SA23, SA34), . . . , and SA3132 of the respective memory cell array blocks MCA1 to MCA32 may operate. For example, in the initial refresh operation, when one word line of each of the memory cell array blocks MCA1, MCA9, MCA17, and MCA25 is selected, the corresponding sense amplification blocks SA12, (SA89, SA910), (SA1617, SA1718), and (SA2425, SA2526) of the respective memory cell array blocks MCA1, MCA9, MCA17, and MCA25 may amplify and store data of memory cells connected to the selected word line. In the initial write operation, when one word line of each of the memory cell array blocks MCA1, MCA9, MCA17, and MCA25 (i.e., a total of four word lines) is selected and all column selection signals csl1 to cslj are activated, the corresponding adjacent sense amplification blocks SA12, (SA89, SA910), (SA1617, SA1718), and (SA2425, SA2526) of the respective memory cell array blocks MCA1, MCA9, MCA17, and MCA25 may amplify a data pair DI/DIB (i.e., an initial data pair), which are transmitted through the corresponding local I/O line groups LIOL12, (LIOL89, LIOL910), (LIOL1617, LIOL1718), and (LIOL2425, LIOL2526), and store the amplified data pair DI/DIB in memory cells connected to the selected word lines.

The local I/O line selector 36-2 may transmit the data pair DI/DIB, which is transmitted through global I/O lines GIOL, to the corresponding local I/O line groups LIOL12, (LIOL12, LIOL23), (LIOL23, LIOL34), . . . , and/or LIOL3132 in response to a write command WR or an initial write command IWR and the corresponding block selection signal B1, B2, . . . , and/or B32. In some embodiments, the local I/O line selector 36-2 may transmit data, which is transmitted through the corresponding local I/O line groups LIOL12, (LIOL12, LIOL23), (LIOL23, LIOL34), . . . , and/or LIOL3132, to the global I/O lines GIOL in response to a read command RD and the corresponding block selection signal B1, B2, . . . , and/or B32. For example, when the block selection signals B1, B9, B17, and B25 are activated in the initial write operation, the local I/O line selector 36-2 may transmit the data pair DI/DIB (i.e., the initial data pair), which is transmitted through the global I/O lines GIOL, to the corresponding local I/O line groups LIOL12, (LIOL89, LIOL910), (LIOL1617, LIOL1718), and (LIOL2425, LIOL2526).

In FIG. 8, even bit lines or odd bit lines of the memory cell array blocks MCA1 and MCA32 may be dummy bit lines, and memory cells connected to the dummy bit lines may not be used. Although not shown, the memory cell array 36 or 36' may include redundant memory cells connected between redundant word lines or redundant bit lines.

Figure 9:
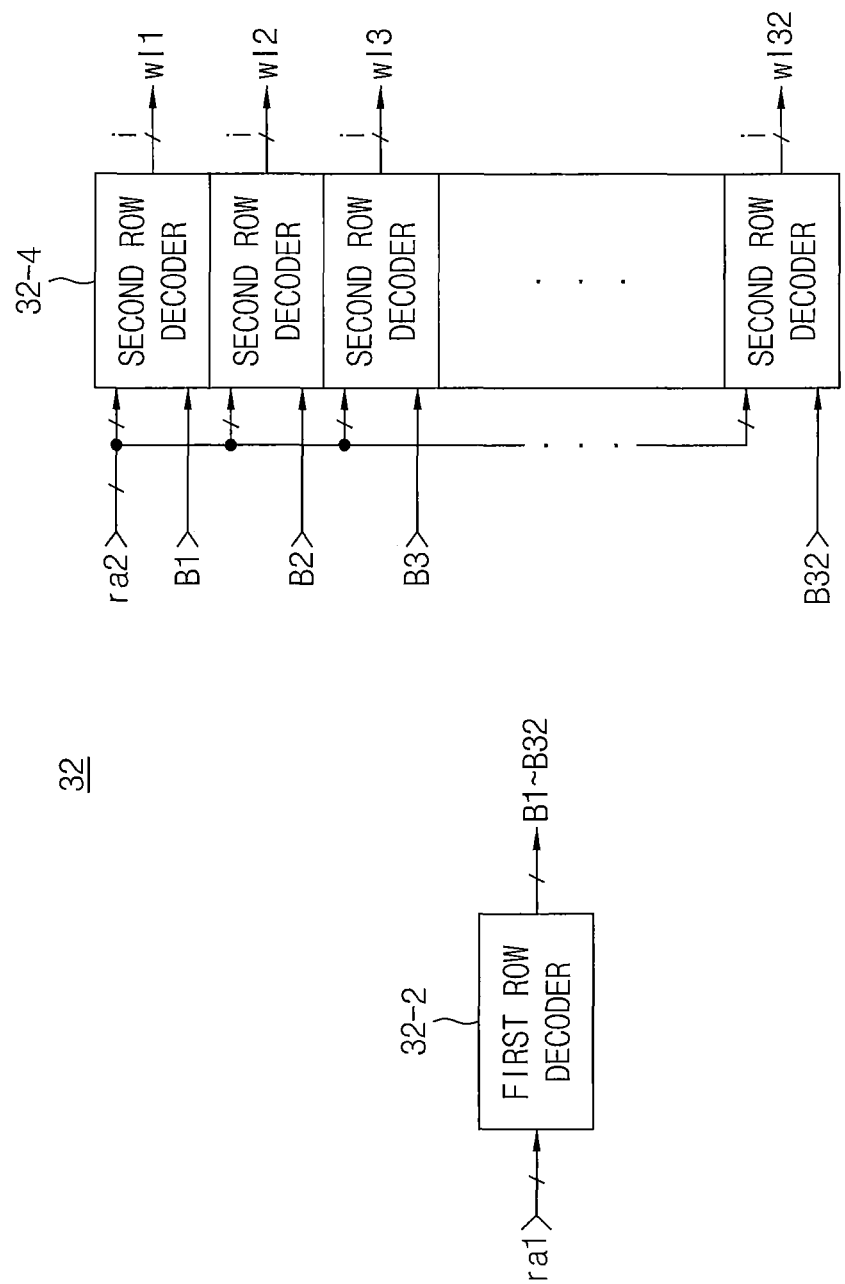
FIG. 9 is a block diagram illustrating a configuration of a row decoder according to an embodiment of the inventive concepts.

FIG. 9 is a block diagram of a configuration of a row decoder according to an embodiment of the inventive concepts. The row decoder 32 may include a first row decoder 32-2 and 32 second row decoders 32-4.

Functions of respective blocks shown in FIG. 9 are as described below.

The first row decoder 32-2 may decode a first row address signal ra1 included in a row address signal ra and generate 32 block selection signals B1 to B32. The first row decoder 32-2 may activate one block selection signal in response to an active command ACT and activate (e.g., simultaneously) at least two block selection signals in response to a refresh command REF or an initial refresh command IREF. The first row decoder 32-2 may decode an upper five bits of a k-bit row address signal and generate 32 block selection signals B1 to B32, decode a lower four bits, three bits, or two bits of the upper five bits, and simultaneously activate two, four, or eight (i.e., $2^n$) of the 32 block selection signals B1 to B32.

Each of the 32 second row decoders 32-4 may decode a second row address signal ra2 included in the row address signal ra in response to the corresponding block selection signal B1, B2, . . . , and/or B32 and generate the corresponding i word line selection signals wl1, wl2, . . . , and/or wl32. The corresponding second row decoder 32-4 may activate one of the corresponding i word line selection signals wl1, wl2, . . . , or wl32.

FIG. 10 is a diagram illustrating an example of an order in which an initial refresh operation or an initial write operation may be performed on memory cell array blocks MCA1 to MCA32 of a memory cell array 36 or 36' according to an embodiment of the inventive concepts.

Column (a) of FIG. 10 is a diagram illustrating an example of an order of operations when an initial refresh operation or an initial write operation is simultaneously performed on one word line of each of two memory cell array blocks (i.e., a total of two word lines). Numbers in parentheses indicate an order in which the initial refresh operation or the initial write operation is performed.

Referring to FIGS. 8, 9, and column (a) of FIG. 10, the initial refresh operation or the initial write operation may be sequentially performed on groups of two word lines of groups of two memory cell array blocks (MCA2, MCA18), (MCA6, MCA22), (MCA4, MCA20), . . . , and (MCA9, MCA25).

More specifically, the first row decoder 32-2 may activate block selection signals B2 and B18. The second row decoder 32-4 may simultaneously activate two word line selection signals wl21 and wl181 from among word line selection signals (wl21 to wl20 and wl181 to wl18i) of the memory cell array blocks MCA2 and MCA18. Thus, an initial refresh operation or an initial write operation on memory cells connected to the word lines WL21 and WL181 of the memory cell array blocks MCA2 and MCA18 may be performed by the sense amplification blocks (SA12, SA23) and (SA1718, SA1819). Next, when the block selection signals B6 and B22 are activated, two word line selection signals wl61 and wl221 from among word line selection signals (wl61 to wl6i) and (wl221 to wl22i) of the memory cell array blocks MCA6 and MCA22 may be simultaneously activated. Thus, an initial refresh operation or an initial write operation on memory cells connected to the word lines WL61 and WL221 of the memory cell array blocks MCA6 and MCA22 may be performed by the sense amplification blocks (SA56, SA67) and (SA2122, SA2223). Finally, when the block selection signals B9 and B25 are activated, two word line selection signals wl91 and wl251, from among word line selection signals (wl91 to wl90 and (wl251 to wl250 of the memory cell array blocks MCA9 and MCA25, may be simultaneously activated. Thus, an initial refresh operation or an initial write operation may be performed on the memory cells connected to word lines WL91 and WL251 of the memory cell array blocks MCA9 and MCA25 by the sense amplification blocks (SA89, SA910) and (SA2425, SA2526). Thus, the initial refresh operation or the initial write operation on the memory cells connected to the word lines WL11, WL21, . . . , and WL321 of the memory cell array blocks MCA1 to MCA32 may be completed.

By using the above-described method, the initial refresh operation or the initial write operation may be sequentially performed on the memory cells connected to the word lines (WL22, WL182), (WL62, WL222), (WL92, WL252), (WL2i, WL18i), (WL6i, WL22i), . . . , and (WL9i, WL25i) of the corresponding two memory cell array blocks (MCA2, MCA18), (MCA6, MCA22), . . . , and (MCA9, MCA25).

Column (b) of FIG. 10 is a diagram illustrating an example of an order of operations when an initial refresh operation or an initial write operation is simultaneously performed on one word line of each of four memory cell array blocks (i.e., a total of four word lines). Numbers in parentheses indicate an order in which the initial refresh operation or the initial write operation is performed.

Referring to FIGS. 8, 9, and column (b) of FIG. 10, the initial refresh operation or the initial write operation may be sequentially performed on groups of four word lines of groups of four memory cell array blocks (MCA2, MCA10, MCA18, MCA26), (MCA6, MCA14, MCA22, MCA30), (MCA4, MCA12, MCA20, MCA28), . . . , and (MCA1, MCA9, MCA17, MCA25).

More specifically, the first row decoder 32-2 may activate the block selection signals B2, B10, B18, and B26. The second row decoder 32-4 may simultaneously activate four word line selection signals wl21, wl101, wl181, and wl261, from among word line selection signals (wl21 to wl2i), (wl101 to wl100, (wl181 to wl18i), and (wl261 to wl26i) of the memory cell array blocks MCA2, MCA10, MCA18, and MCA26). Thus, the initial refresh operation or the initial write operation on the memory cells connected to word lines WL21, WL101, WL181, and WL261 of the memory cell array blocks MCA2, MCA10, MCA18, and MCA26 may be performed by the sense amplification blocks (SA12, SA23), (SA910, SA1011), (SA1718, SA1819), and (SA2526, SA2627). Next, when the block selection signals B6, B14, B22, and B30 are activated, four word line selection signals wl61, wl141, wl221, and wl301, from among word line selection signals (wl61 to wl6i), (wl141 to wl14i), (wl221 to wl22i), and (wl301 to wl30i) of the memory cell array blocks MCA6, MCA14, MCA22, and MCA30), may be simultaneously activated. Thus, the initial refresh operation or the initial write operation on memory cells connected to word lines WL61, WL141, WL221, and WL301 of the memory cell array blocks MCA6, MCA14, MCA22, and MCA30 may be performed by the sense amplification blocks (SA56, SA67), (SA1314, SA1415), (SA2122, SA2223), and (SA2930, SA3031). Finally, when the block selection signals B1, B9, B17, and B25 are activated, four word line selection signals wl11, wl91, wl171, and wl251, from among the word line selection signals (wl11 to wl1$i$), (wl91 to wl90, (wl171 to wl17$i$), and (wl251 to wl250 of the memory cell array blocks MCA1, MCA9, MCA17, and MCA25), may be simultaneously activated. Thus, the initial refresh operation or the initial write operation on memory cells connected to word lines WL11, WL91, WL171, and WL251 of the memory cell array blocks MCA1, MCA9, MCA17, and MCA25 may be performed by the sense amplification blocks SA12, (SA89, SA910), (SA1617, SA1718), and (SA2425, SA2526). As a result, the initial refresh operation or the initial write operation on the memory cells connected to the word lines WL11, WL21, . . . , and WL321 of the memory cell array blocks MCA1 to MCA32 may be completed.

By using the above-described method, the initial refresh operation or the initial write operation may be sequentially performed on the memory cells connected to the word lines (WL22, WL102, WL182, WL262), (WL62, WL142, WL222, WL302), (WL12, WL92, WL172, WL252), (WL2$i$, WL10$i$, WL18$i$, WL26$i$), (WL6$i$, WL14$i$, WL22$i$, WL30$i$), . . . , and (WL1$i$, WL9$i$, WL17$i$, WL25$i$) of the corresponding four memory cell array blocks (MCA2, MCA10, MCA18, MCA26), (MCA6, MCA14, MCA22, MCA30), . . . , and (MCA1, MCA9, MCA17, MCA25).

It will be understood that the groupings and order of the memory cells illustrated in FIG. 10 are merely examples, and that other groupings of memory cells and/or a different order of the grouped memory cells in an initial refresh operation or an initial write operation may be selected without deviating from the present inventive concepts.

Although not shown, the initial refresh operation or the initial write operation can be simultaneously performed on one word line of each of eight memory cell array blocks (i.e., a total of eight word lines).

According to the example embodiments of the inventive concepts, a semiconductor memory device and a memory system including the same can perform an initial refresh operation or an initial write operation on memory cells in an initialization operation and reliably initialize data of the memory cells. Thus, reliability of operations of the semiconductor memory device and the memory system including the same can be ensured.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor memory device comprising:
a power-up signal generator configured to generate a power-up signal in response to a memory voltage reaching a target voltage level;
an initializer configured to generate an initialization signal in response to the power-up signal and a reset signal and to generate an initial refresh command in response to completion of an initialization operation;
a memory cell array comprising a plurality of memory cells connected between a plurality of word lines and a plurality of bit lines, the memory cell array configured to perform an initial refresh operation on the plurality of memory cells in response to the initial refresh command; and
a command/address generator configured to receive a clock enable signal and a chip selection signal in response to a clock signal and generate a power-down exit command, wherein the initializer is configured to generate the initial refresh command when the initialization operation is completed at a third time point before a first time point at which the power-down exit command is generated and after a second time point at which the clock signal is applied.

2. The semiconductor memory device of claim 1, wherein the semiconductor memory device further comprises a initialization operation unit that is configured to receive the initialization signal from the initializer and is configured to perform the initialization operation in response to the initialization signal from the initializer, wherein the initializer is configured to generate the initial refresh command when the initialization operation of the initialization operation unit is completed.

3. The semiconductor memory device of claim 1, wherein the command/address generator is configured to decode the chip selection signal and a command signal in response to the clock signal and to further generate a refresh command, an active command, a write command, a read command, or a mode setting command, to generate a row address from an address signal in response to the active command, to generate a column address from the address signal in response to the write command or the read command, and to generate a mode setting code from the address signal in response to the mode setting command, wherein the semiconductor memory device is configured to complete the initial refresh operation at a fifth time point between the first time point and a fourth time point at which the mode setting command is applied or at a seventh time point between the first time point and a sixth time point at which a mode setting operation is ended in response to the mode setting command.

4. The semiconductor memory device of claim 3, further comprising:

a refresh row address generator configured to generate a refresh row address in response to the initial refresh command or the refresh command;

a row address generator configured to generate a row address signal from the refresh row address in response to the initial refresh command or the refresh command or generate the row address signal from the row address in response to the active command;

a row decoder configured to decode the row address signal in response to the initial refresh command or the refresh command and activate at least two word line selection signals or decode the row address signal in response to the active command and activate at least one word line selection signal; and a column decoder configured to decode a column address signal in response to the write command or the read command and activate at least one column selection signal.

5. The semiconductor memory device of claim 4, wherein the memory cell array comprises:

a plurality of memory cell array blocks comprising a plurality of memory cells connected between the plurality of word lines and the plurality of bit lines; and a plurality of sense amplification blocks between the plurality of memory cell array blocks and configured to amplify data of the plurality of bit lines, wherein, responsive to at least two word lines of at least two of the memory cell array blocks being selected in response to the at least two word line selection signals in the initial refresh operation, the sense amplification blocks that are on both sides of each of the at least two memory cell array blocks are configured to amplify and store data stored in the memory cells connected to the at least two word lines.

6. A semiconductor memory device comprising:

a power-up signal generator configured to generate a power-up signal in response to a memory voltage reaching a target voltage level;

an initializer configured to generate an initialization signal in response to the power-up signal and a reset signal and to generate an initial refresh command and an initial write command in response to completion of an initialization operation;

an initial data driver configured to drive initial data in response to the initial write command; and a memory cell array comprising a plurality of memory cells connected between a plurality of word lines and a plurality of bit lines, the memory cell array configured to perform an initial write operation of writing the initial data to the plurality of memory cells in response to the initial refresh command and the initial write command.

7. The semiconductor memory device of claim 6, further comprising a command/address generator configured to receive a clock enable signal and a chip selection signal in response to a clock signal and generate a power-down exit command, wherein the initializer is configured to generate the initial refresh command and the initial write command in response to the initialization operation being completed at a third time point before a first time point at which the power-down exit command is applied and after a second time point at which the clock signal is applied.

8. The semiconductor memory device of claim 7, further comprising an initialization operation unit configured to perform the initialization operation in response to the initialization signal, wherein the initializer generates the initial refresh command and the initial write command in response to the completion of the initialization operation of the initialization operation unit.

9. The semiconductor memory device of claim 7, wherein the command/address generator is configured to decode the chip selection signal and a command signal in response to the clock signal and to further generate a refresh command, an active command, a write command, a read command, or a mode setting command, to generate a row address from an address signal in response to the active command, to generate a column address from the address signal in response to the write command or the read command, and to generate a mode setting code from the address signal in response to the mode setting command, wherein the semiconductor memory device is configured to complete the initial write operation at a fifth time point between the first time point and a fourth time point at which the mode setting command is applied or at a seventh time point between the first time point and a sixth time point at which a mode setting operation is ended in response to the mode setting command.

10. The semiconductor memory device of claim 9, further comprising:

a refresh row address generator configured to generate a refresh row address in response to the initial refresh command or the refresh command;

a row address generator configured to generate a row address signal from the refresh row address in response to the initial refresh command or the refresh command or generate the row address signal from the row address in response to the active command;
a row decoder configured to decode the row address signal in response to the initial refresh command or the refresh command and activate at least two word line selection signals or to decode the row address signal in response to the active command and activate at least one word line selection signal; and
a column decoder configured to activate all of a plurality of column selection signals in response to the initial write command or to decode a column address signal in response to the write command or the read command and activate at least one column selection signal.

11. The semiconductor memory device of claim 10, further comprising:
a plurality of memory cell array blocks comprising a plurality of memory cells connected between the plurality of word lines and the plurality of bit lines; and
a plurality of sense amplification blocks between the plurality of memory cell array blocks and configured to amplify data of the plurality of bit lines,
wherein at least two word lines of at least two of the memory cell array blocks are selected in response to the at least two word line selection signals in the initial write operation, and the sense amplification blocks disposed on both sides of each of the at least two memory cell array blocks are configured to write the initial data to the memory cells connected to the at least two word lines.

12. The semiconductor memory device of claim 7, wherein the initial data driver comprises:
a first driver configured to drive first initial data in the initial write operation; and
a second driver configured to drive second initial data in the initial write operation.

13. The semiconductor memory device of claim 7, wherein the initial data driver comprises:
a first latch configured to initialize a first node to a first initial value in response to the initialization signal and to latch the first initial value or input data;
a second latch configured to initialize a second node to a second initial value in response to the initialization signal and to latch the second initial value or inverted input data;
a first driver configured to drive the first initial value in the initial write operation or to drive the input data in a normal operation; and
a second driver configured to drive the second initial value in the initial write operation or to drive the inverted input data in the normal operation.

14. A memory system comprising:
a controller configured to generate a reset signal in response to a power-up operation signal or a reset operation signal; and
a memory configured to receive the reset signal,
wherein the memory comprises:
a power-up signal generator configured to generate a power-up signal in response to a memory voltage reaching a target voltage level;
an initializer configured to generate an initialization signal in response to the power-up signal and the reset signal and to generate an initial refresh command in response to completion of an initialization operation;
a memory cell array comprising a plurality of memory cells connected between a plurality of word lines and a plurality of bit lines, the memory cell array configured to perform an initial refresh operation on the plurality of memory cells in response to the initial refresh command.

15. The memory system of claim 14, wherein the initializer is configured to further generate an initial write command in response to an initialization completion signal,
wherein the memory further comprises an initial data driver configured to drive initial data in response to the initial write command, and
wherein the memory cell array is configured to perform an initial write operation of writing the initial data to the plurality of memory cells in response to the initial refresh command and the initial write command.

16. The memory system of claim 15, wherein the memory further comprises a command/address generator configured to receive a clock enable signal and a chip selection signal from the controller in response to a clock signal applied from the controller and generate a power-down exit command,
wherein the initializer is configured to generate the initial refresh command or to generate the initial refresh command and the initial write command in response to the completion of the initialization operation at a third time point before a first time point at which the power-down exit command is applied and after a second time point at which the clock signal is applied.

17. The memory system of claim 16, wherein the memory further comprises an initialization operation unit configured to perform the initialization operation in response to the initialization signal,
wherein the initializer is configured to generate the initial refresh command or to generate the initial refresh command and the initial write command in response to the completion of the initialization operation of the initialization operation unit.

18. The memory system of claim 16, wherein the command/address generator is configured to decode the chip selection signal and a command signal in response to the clock signal and further generates a refresh command, an active command, a write command, a read command, or a mode setting command, to generate a row address from an address signal included in the command/address in response to the active command, generates a column address from the address signal in response to the write command or the read command, and generates a mode setting code from the address signal in response to the mode setting command,
wherein the memory completes the initial refresh operation or the initial write operation at a fifth time point between the first time point and a fourth time point at which the mode setting command is applied or at a seventh time point between the first time point and a sixth time point at which a mode setting operation is ended in response to the mode setting command.

19. The memory system of claim 18, wherein the memory cell array comprises:
a plurality of memory cell array blocks comprising a plurality of memory cells connected between the plurality of word lines and the plurality of bit lines; and
a plurality of sense amplification blocks disposed between the plurality of memory cell array blocks and configured to amplify data of the plurality of bit lines,
wherein responsive to at least two word lines of at least two of the memory cell array blocks being selected in response to at least two word line selection signals in the initial refresh operation or the initial write operation, the sense amplification blocks disposed on both sides of each of the at least two memory cell array blocks amplify and store data stored in the memory cells connected to the at least two word lines or amplify and store the initial data.

* * * * *